(12) United States Patent
Yamamoto et al.

(10) Patent No.: US 8,133,598 B2
(45) Date of Patent: Mar. 13, 2012

(54) HARD COATING FILM, METHOD OF FORMATION THEREOF, AND MATERIAL COATED WITH HARD COATING FILM

(75) Inventors: Kenji Yamamoto, Kobe (JP); Shohei Nakakubo, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 137 days.

(21) Appl. No.: 12/393,177

(22) Filed: Feb. 26, 2009

(65) Prior Publication Data
US 2010/0215975 A1 Aug. 26, 2010

(30) Foreign Application Priority Data
Apr. 3, 2008 (JP) .................... 2008-097131

(51) Int. Cl.
*B32B 9/00* (2006.01)

(52) U.S. Cl. ............ 428/697; 204/192.15; 204/192.16; 428/698; 428/699; 428/701

(58) Field of Classification Search .............. 428/697, 428/698, 699, 701, 702; 204/192.15, 192.16
See application file for complete search history.

(56) References Cited

U.S. PATENT DOCUMENTS

| | | | | |
|---|---|---|---|---|
| 4,180,400 A | * | 12/1979 | Smith et al. | 428/546 |
| 4,357,382 A | * | 11/1982 | Lambert et al. | 428/699 |
| 4,701,384 A | * | 10/1987 | Sarin et al. | 428/698 |
| 4,743,502 A | * | 5/1988 | Yoshitomi et al. | 428/704 |
| 4,746,563 A | * | 5/1988 | Nakano et al. | 428/698 |
| 5,310,607 A | | 5/1994 | Schulz et al. | |
| 5,918,261 A | * | 6/1999 | Williams et al. | 73/31.06 |
| 6,046,054 A | * | 4/2000 | McGeehin et al. | 436/121 |
| 6,824,601 B2 | * | 11/2004 | Yamamoto et al. | 204/192.15 |
| 7,018,727 B2 | * | 3/2006 | Dzick | 428/699 |
| 7,326,461 B2 | * | 2/2008 | Sottke et al. | 428/702 |
| 7,537,822 B2 | * | 5/2009 | Ishikawa | 428/699 |
| 7,550,208 B2 | * | 6/2009 | Ritz et al. | 428/697 |
| 2005/0136656 A1 | * | 6/2005 | Zeng et al. | 118/722 |

FOREIGN PATENT DOCUMENTS

| | | | |
|---|---|---|---|
| DE | 195 11 628 A1 | | 10/1996 |
| EP | 0 513 662 A1 | | 11/1992 |
| EP | 656 111 | * | 2/2000 |

(Continued)

OTHER PUBLICATIONS

S. Coste, et al., "Microstructural and Mechanical Characterization of Mechanically-Activated Plasma-Sprayed Nanostructured A1203-Ti02 and A1203-Zr02 Coatings", Advances in Science and Technology, Database Accession No. 149:14214, XP002532099, 2006, 1 page.

(Continued)

*Primary Examiner* — Archene Turner
(74) *Attorney, Agent, or Firm* — Oblon, Spivak, McClelland, Maier & Neustadt, L.L.P.

(57) ABSTRACT

A hard coating film having wear resistance superior to conventional TiAlN coating films, oxide coating films, and the like. The hard coating film of the present invention has a component composition represented by one of the following two formulas:

$(Ti_aAl_bSi_c)O_x$, wherein $0.3 \leq a \leq 0.7$, $0.3 \leq b \leq 0.7$, $0 \leq c \leq 0.2$, $a+b+c=1$, and $0.8 \leq [x/(2a+1.5b+2c)] \leq 1.2$; and $(Ti_aCr_dAl_bSi_c)O_x$, wherein $0.05 \leq a \leq 0.4$, $0.1 \leq d \leq 0.85$, $0 \leq b \leq 0.7$, $0 \leq c \leq 0.2$, $a+b+c+d=1$, and $0.8 \leq [x/(2a+1.5d+1.5b+2c)] \leq 1.2$;

where variables a, d, b, and c denote the atomic ratios of Ti, Cr, Al, and Si respectively, and variable x indicates the atomic ratio of O.

13 Claims, 1 Drawing Sheet

FOREIGN PATENT DOCUMENTS

| | | | |
|---|---|---|---|
| GB | 2202948 | * | 10/1988 |
| JP | 4-144974 | | 5/1992 |
| JP | 8-209333 | | 8/1996 |
| JP | 2644710 | | 5/1997 |
| JP | 2000-246507 | | 9/2000 |
| JP | 3323534 | | 6/2002 |

OTHER PUBLICATIONS

Graham A. Shaw, et al., "Atmospheric Pressure Chemical Vapour Depostion of $Cr_{2-x}Ti_xO_3$ (CTO) Thin Films ($\leqq 3$ μm) on to Gas Sensing Substrates", Journal of Materials Chemistry, 13, XP002532098, Oct. 15, 2003, pp. 2957-2962.

* cited by examiner

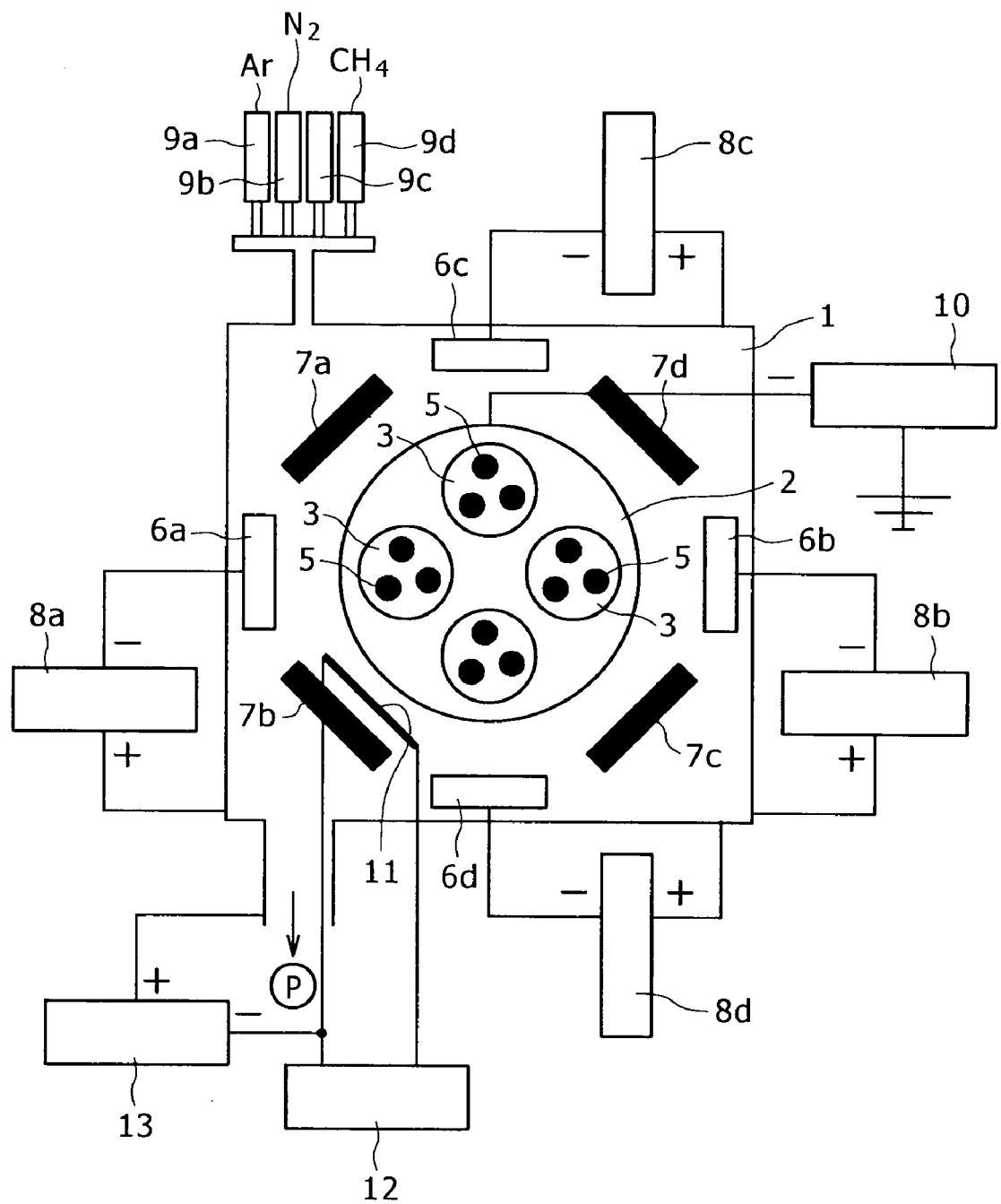

HARD COATING FILM, METHOD OF FORMATION THEREOF, AND MATERIAL COATED WITH HARD COATING FILM

BACKGROUND OF THE INVENTION

1. Field of the Invention

The present invention relates to a hard coating film, a method of forming a hard coating film, and a material coated with a hard coating film. More particularly, the invention relates to a hard coating film formed on a substrate for enhancing the wear resistance thereof in the fabrication of cutting tools to be used for such purposes as metal cutting, drilling and end milling, metal dies to be used for such purposes as forging, press molding and extrusion molding, and jigs and tools to be used for such purposes as punching in plastic metal working.

2. Description of the Related Art

Conventionally, on a cutting tool made of a substrate such as cemented carbide, cermet or high-speed tool steel, for example, a hard coating film formed of such a substance as TiN (nitride of Ti), TiCN (carbonitride of Ti), or TiAlN (complex nitride of Ti and Al) has been provided for enhancing the wear resistance thereof. In particular, as disclosed in Patent Document 1 indicated below, a hard coating film formed of TiAlN, which has excellent wear resistance, is becoming prevalent in lieu of a hard coating film formed of TiN or TiCN. However, there is still an increasing demand for a hard coating film having higher resistance to wear in order to meet an increase in hardness of work materials and an increase in cutting speed required therefor in recent years.

An example of a hard coating film formed of oxide is found in Patent Document 2 indicated below, which discloses the following description: When a layer consisting essentially of an oxide of aluminum is formed at low temperature, a high degree of hardness cannot be achieved due to occurrence of an amorphous state. Therefore, for forming a crystalline oxide coating film at low temperature, it is proposed to use a complex oxide material (Al, Cr), which contains chromium that is an element capable of forming an oxide substance having the same crystalline structure (corundum) as that of an oxide of aluminum and capable of providing crystalline oxide formation at low temperature. However, in the use of this complex oxide material (Al, Cr), the crystallinity of an oxide coating film formed is unsatisfactory due to residual amorphousness, giving rise to difficulty in achieving a high degree of hardness.

Patent Document 1:
Japanese Patent No. 2644710
Patent Document 2:
Japanese Patent No. 3323534

OBJECT AND SUMMARY OF THE INVENTION

In view of the above, it is a general object of the present invention to provide a hard coating film having a wear resistance characteristic superior to those of conventional TiAlN coating films, oxide coating films, and the like, a method of formation thereof, and a material coated therewith.

In accomplishing this object of the present invention and according to one aspect thereof, there is provided a first hard coating film formed on the surface of a substrate, the first hard coating film comprising a component composition represented by the formula:

$$(Ti_aAl_bSi_c)O_x$$

wherein
$0.3 \leq a \leq 0.7$
$0.3 \leq b \leq 0.7$
$0 \leq c \leq 0.2$
$a+b+c=1$
$0.8 \leq [x/(2a+1.5b+2c)] \leq 1.2$
where variables a, b, and c denote the atomic ratios of Ti, Al, and Si respectively, and variable x indicates the atomic ratio of O.

According to another aspect of the present invention, there is provided a second hard coating film formed on the surface of a substrate, the second hard coating film comprising a component composition represented by the formula:

$$(Ti_aCr_dAl_bSi_c)O_x$$

wherein
$0.05 \leq a \leq 0.4$
$0.1 \leq d \leq 0.85$
$0 \leq b \leq 0.7$
$0 \leq c \leq 0.2$
$a+b+c+d=1$
$0.8 \leq [x/(2a+1.5d+1.5b+2c)] \leq 1.2$
where variables a, d, b, and c denote the atomic ratios of Ti, Cr, Al, and Si respectively, and variable x indicates the atomic ratio of O.

Further, according to another aspect of the present invention, there is provided a hard-coated material comprising a substrate and the first or second hard coating film formed on the surface of the substrate.

Moreover, according to another aspect of the present invention, the hard-coated material comprising a substrate and the first or second hard coating film formed on the surface of the substrate may further comprise an intermediate layer formed of a nitride containing one species or more of Ti and Cr, the intermediate layer being interleaved between the substrate and the first or second hard coating film.

Furthermore, in the fabrication of a preferred form of the hard-coated material comprising a substrate, the first or second hard coating film, and the intermediate layer interleaved between the substrate and the first or second hard coating film, the first or second hard coating film is formed on the surface of the intermediate layer after the surface of the intermediate layer is oxidized under processing conditions of 500° C. or more in substrate temperature and one Pa or more in oxygen partial pressure. In the fabrication of another preferred form of the hard-coated material comprising a substrate, the first or second hard coating film, and the intermediate layer interleaved between the substrate and the first or second coating film, the intermediate layer has a graded composition in which the content of nitrogen gradually decreases and the content of oxygen gradually increases in the direction from the substrate to the first or second hard coating film.

Still further, according to another aspect of the present invention, there is provided a method of forming the first or second hard coating film, wherein the first or second hard coating film is formed in an atmosphere having an oxygen partial pressure ranging from 0.5 Pa to 4 Pa inclusive by means of cathode-discharge arc ion plating.

As set forth hereinabove and according to the present invention, it is possible to provide a hard coating film having a wear resistance characteristic superior to those of conventional TiAlN coating films, oxide coating films, and the like. The hard coating film having higher resistance to wear in accordance with the present invention is highly useful as a film formed on the surface of a substrate in the fabrication of various cutting tools to be used for metal working, metal dies to be used for forging, press molding and extrusion molding, and jigs and tools to be used for punching in plastic metal working, for example.

The above and other objects, features and advantages of the present invention will become more apparent from the following detailed description.

BRIEF DESCRIPTION OF THE DRAWING

FIG. 1 is an explanatory schematic diagram showing a configuration example of a film forming apparatus for producing hard coating films according to a preferred embodiment of the present invention.

DETAILED DESCRIPTION OF THE PREFERRED EMBODIMENTS

The present inventors have conducted intensive examinations from various points of view to attain a hard coating film having excellent resistance to wear. As a result of these examinations, it was found that significant enhancement in wear resistance can be provided in a hard coating oxide film that contains Ti as an essential component element, Si as an effective component element for stabilizing oxide film formation, and Al and Cr as advantageous component elements for easy achievement of a high degree of hardness. As regards the hard coating film of the present invention accomplished to provide excellent wear resistance, the following describes reasons for selection of the above elements and for limitations in compositional ranges thereof.

In a preferred embodiment of the present invention, a first hard coating film is defined as comprising a component composition represented by the formula:

$$(Ti_aAl_bSi_c)O_x$$

wherein
$0.3 \leq a \leq 0.7$
$0.3 \leq b \leq 0.7$
$0 \leq c \leq 0.2$
$a+b+c=1$
$0.8 \leq [x/(2a+1.5b+2c)] \leq 1.2$ where variables a, b, and c denote the atomic ratios of Ti, Al, and Si respectively, and variable x indicates the atomic ratio of O. (The same shall apply hereinafter.)

As mentioned in the foregoing, when a layer consisting essentially of an oxide of aluminum is formed at low temperature, it is difficult to achieve a high degree of hardness due to occurrence of an amorphous state. However, the addition of Ti provides a crystalline phase in an oxide coating film, making it possible to increase hardness thereof. To produce this advantageous effect, it is required that the content of Ti (a) should be 0.3 or more, preferably 0.4 or more. It is however to be noted that if the content of Ti exceeds 0.7, a crystalline structure transition to Ti oxide (rutile) is likely to occur, resulting in a decrease in hardness. Hence, the upper limit of Ti content should be 0.7, preferably no higher than 0.6.

If the content of Al (b) is less than 0.3, it is impossible to ensure adequately high hardness. The lower limit of Al content should therefore be 0.3, preferably 0.4 or more. On the other hand, if the content of Al exceeds 0.7, an amorphous state occurs to make it difficult to achieve high hardness. Hence, the upper limit of Al content should be 0.7, preferably no higher than 0.6.

An oxide of Si, which has a relatively low level of free energy in formation thereof, is appreciably stable as compared with an oxide of Ti. For the formation of a stable oxide coating film, it is therefore desirable to further contain Si as a component element. From this point of view, the content of Si (c) should be preferably 0.03 or more. However, if Si is contained excessively, an amorphous state occurs in oxide coating film formation. Hence, the upper limit of Si should be 0.2, preferably no higher than 0.1.

The atomic ratios of metallic elements (Ti, Al, and Si) to oxygen vary depending on the species and ratios of metallic elements constituting an oxide coating film. Theoretically, Ti is oxidized to $TiO_2$, Al to $Al_2O_3$, and Si to $SiO_2$. Hence, in the case of an oxide coating film comprising the above component composition of $(Ti_aAl_bSi_c)O_x$, x is equal to 2a+1.5b+2c in terms of stoichiometric oxide formation. That is to say, the theoretical value of x/(2a+1.5b+2c) is 1; however, an actual value corresponding thereto varies depending on such factors as film forming conditions. Under certain film forming conditions, when the content of oxygen in an oxide coating film decreases to cause a metal-rich state, a decrease in the hardness of the oxide coating film is prone to occur. In the present invention, it is therefore specified that the value of x should be 0.8 times or more the content of oxygen in stoichiometric oxide formation (2a+1.5b+2c), i.e., the actual value of x/(2a+1.5b+2c) should be 0.8 or more. On the other hand, although the value of x does not exceed (2a+1.5b+2c) basically, the upper limit of x should be 1.2 times (2a+1.5b+2c) in consideration of measurement errors or the like.

Specifically, $(Ti_{0.5}Al_{0.5})O$ and $(Ti_{0.5}Al_{0.45}Si_{0.05})O$ are recommended as preferable compositions of the above first hard coating film.

In another preferred embodiment of the present invention, a second hard coating film is defined as comprising a component composition represented by the formula:

$$(Ti_aCr_dAl_bSi_c)O_x$$

wherein
$0.05 \leq a \leq 0.4$
$0.1 \leq d \leq 0.85$
$0 \leq b \leq 0.7$
$0 \leq c \leq 0.2$
$a+b+c+d=1$
$0.8 \leq [x/(2a+1.5d+1.5b+2c)] \leq 1.2$ where variables a, d, b, and c denote the atomic ratios of Ti, Cr, Al, and Si respectively, and variable x indicates the atomic ratio of O. (The same shall apply hereinafter.)

In the formation of the second hard coating film, Cr is further added to the composition of the first hard coating film mentioned hereinabove, thereby forming Cr—O bonding to provide a further increase in hardness. To produce this advantageous effect adequately, it is required that the content of Cr (d) should be 0.1 or more, preferably 0.15 or more. Since an oxide of Cr itself is excellent in wear resistance, it seems desirable to increase the proportion of Cr. However, if the content of Cr exceeds 0.8, the proportions of Al and Ti become relatively smaller to cause a decrease in hardness. Hence, the upper limit of Cr content should be 0.85, preferably no higher than 0.7.

To ensure high hardness, the content of Al (b) should be preferably 0.1 or more, more preferably 0.2 or more. On the other hand, if the content of Al exceeds 0.7, an amorphous state occurs to make it difficult to achieve high hardness as aforementioned. Hence, the upper limit of Al content should be 0.7, preferably no higher than 0.6, and more preferably no higher than 0.5.

The inclusion of Ti in an oxide coating film can make the hardness thereof higher than that of a coating film formed of an oxide of Cr only and that of a coating film formed of an oxide of Cr and Al. The content of Ti (a) should therefore be 0.05 or more, preferably 0.1 or more. However, if Ti is contained excessively, a decrease in hardness takes place contrarily as in the case of the first hard coating film. Hence, the upper limit of Ti content should be 0.4, preferably no higher than 0.3, and more preferably no higher than 0.2.

An oxide of Si, which has a relatively low level of free energy in formation thereof, is appreciably stable as compared with an oxide of Ti. For the formation of a stable oxide coating film, it is therefore desirable to further contain Si as a component element. From this point of view, the content of Si (c) should be preferably 0.03 or more. However, if Si is contained excessively, an amorphous state occurs in oxide coating film formation. Hence, the upper limit of Si content should be 0.2, preferably no higher than 0.1.

In the second hard coating film, the atomic ratios of metallic elements (Ti, Al, Cr, and Si) to oxygen also vary depending on the species and ratios of metallic elements constituting an oxide coating film. Theoretically, Ti is oxidized to $TiO_2$, Cr to $Cr_2O_3$, Al to $Al_2O_3$, and Si to $SiO_2$. Hence, in the case of an oxide coating film comprising the above component composition of $(Ti_aCr_dAl_bSi_c)O_x$, x is equal to 2a+1.5d+1.5b+2c in terms of stoichiometric oxide formation. That is to say, the theoretical value of x/(2a+1.5d+1.5b+2c) is 1; however, an actual value corresponding thereto varies depending on such factors as film forming conditions. Under certain film forming conditions, when the content of oxygen in an oxide coating film decreases to cause a metal-rich state, a decrease in the hardness of the oxide coating film is prone to occur. In the present invention, it is therefore specified that the value of x should be 0.8 times or more the content of oxygen in stoichiometric oxide formation (2a+1.5d+1.5b+2c), i.e., the actual value of x/(2a+1.5d+1.5b+2c) should be 0.8 or more. On the other hand, although the value of x does not exceeds (2a+1.5d+1.5b+2c) basically, the upper limit of x should be 1.2 times (2a+1.5d+1.5b+2c) in consideration of measurement errors or the like.

Specifically, $(Ti_{0.1}Cr_{0.3}Al_{0.6})O$, $(Ti_{0.1}Cr_{0.4}Al_{0.5})O$, and $(Ti_{0.2}Cr_{0.2}Al_{0.55}Si_{0.05})O$ are recommended as preferable compositions of the above second hard coating film.

In another preferred embodiment of the present invention, there is provided an arrangement in which two layers or more selected from the first and second hard coating films are formed in a laminated structure in addition to a single-layer structure comprising the first or second hard coating film.

In either of the single-layer and multi-layer structures, it is preferable that the thickness of the hard coating film of the present invention should be within the range of 0.05 μm to 20 μm inclusive. If the hard coating film is formed to have a thickness of less than 0.05 μm, the film thickness is too small to provide adequate resistance to wear. On the other hand, if the film thickness exceeds 20 μm, there may occur a chipping or peeling-off of a part of the film during cutting operation.

In the present invention, there is also included a hard-coated material comprising a substrate and at least one of the first and second hard coating films formed on the surface of the substrate. (For the sake of convenience, the first or second hard coating film will be hereinafter referred to simply as the hard coating film in some cases.)

The hard-coated material mentioned above may further comprise an intermediate layer formed of a nitride containing one species or more of Ti and Cr, the intermediate layer being interleaved between the substrate and the hard coating film. Since either of the first and second coating films is a considerably stable compound, the reactivity thereof with the substrate is rather low, i.e., the hard coating film may provide insufficient adhesiveness to the substrate. Hence, in another preferred embodiment of the present invention, the intermediate film is formed between the substrate and the hard coating film as stated above in order to enhance adhesiveness to the substrate, thereby ensuring the wear resistance of the hard coating film for a long time. Examples of applicable nitrides each containing one species or more of Ti and Cr in the formation of the intermediate layer include TiN, CrN, TiCrN, TiAlN, TiCrAlN, CrAlN, and the like.

It is preferable that the thickness of the intermediate layer mentioned above should be within the range of 0.01 μm to 5 μm inclusive. If the intermediate layer is formed to have a thickness of less than 0.01 μm, the thickness is too small to provide adequate adhesiveness. On the other hand, if the thickness exceeds 5 μm, there may occur a chipping or peeling-off of a part of the hard coating film or the intermediate layer.

To ensure adhesiveness between the intermediate layer and the hard coating film, the hard coating film is preferably formed after the surface of the intermediate layer is oxidized under processing conditions of 500° C. or more in substrate temperature and one Pa or more in oxygen partial pressure, as will be described later in further detail.

As another preferable form of the present invention to enhance adhesiveness between the intermediate layer and the hard coating film, the intermediate layer may have a graded composition in which the content of nitrogen gradually decreases and the content of oxygen gradually increases in the direction from the substrate to the hard coating film. The provision of such a composition gradient in the intermediate layer can suppress abrupt compositional variations at the interface between the hard coating film and the nitride constituting the intermediate layer, contributing to further enhancement of adhesiveness. The composition gradient in the intermediate layer may be either continuous or stepwise, or either linear or curvilinear. Further, the composition gradient may be of a monotonously varying type or of a resultantly unidirectionally varying type involving repetitive increments and decrements.

The kind of the substrate mentioned above should be determined according to the kind of the hard-coated material to be provided. Various steel products such as carbon steels for machine structural use, alloy steels for structural use, tool steels and stainless steels, and various metallic products such as cemented carbide metals are applicable as substrates. Further, the substrate may comprise an undercoating layer such as a plating layer or sprayed coating layer formed on the surface thereof.

The hard-coated material of the present invention is to be used as a cutting tool for metal cutting, drilling or end milling, as a metal die for forging, press molding or extrusion molding, or as a jig or tool for punching in plastic metal working, for example. In particular, the hard-coated material of the present invention is highly advantageous when used as an insert tool for continuous cutting or as a cutting tool for intermittent cutting in such a metal working process as milling (end milling) or drilling. In the case of a nitride film intended to provide wear resistance by the formation of stable oxide due to heat generated at the time of cutting, chips impinge on a cutting face continuously to produce a low-oxygen atmosphere thereon to cause hindrance to the formation of an adequate amount of oxide, resulting in difficulty in provision of wear resistance. By way of contrast, the hard-coated material of the present invention is capable of providing excellent wear resistance even if chips impinge on a cutting face continuously to produce a low-oxygen atmosphere thereon. From this point of view, the hard-coated material of the present invention is particularly suitable for use as an insert tool for continuous cutting. Further, the hard coating film of the present invention is also applicable as a wear-resistant coating film or a fusion-resistant coating film on a metal mold for die-casting or any other part to be in contact with molten metal.

For the formation of the hard coating film of the present invention, it is recommended to employ a cathode-discharge arc ion plating method in which a target is placed in an atmosphere having an oxygen partial pressure ranging from 0.5 Pa to 4 Pa inclusive. In an instance where an aluminum oxide film is formed by means of chemical vapor deposition (CVD), the temperature of a substrate reaches a high level in the vicinity of 1000° C. at the time of film formation, giving rise to such a problem as thermal distortion of the substrate. CVD is therefore not applicable to fabrication of tools having precise configurations. In contrast, the cathode-discharge arc ion plating method allows carrying out film formation at a relatively low temperature without causing the temperature of a substrate to increase to such a high level as mentioned above.

In the present invention, a hard coating film shall be formed by means of cathode-discharge arc ion plating (hereinafter referred to simply as AIP in some cases), which is a kind of physical vapor deposition (PVD). In an instance where a sputtering method is used in an attempt to form the hard coating film of the present invention in an atmosphere having an oxygen partial pressure in the range indicated above, it is difficult to regulate the composition of an oxide coating film to be formed in the oxygen partial pressure range since there is no linear relationship between the levels of oxygen partial pressure applied and the levels of oxygen content in hard coating film formation. Since the sputtering method is also disadvantageous in that the film forming rate thereof is rather low, it is recommended to use AIP for film formation in the present invention.

Under a film forming condition where there is provided an atmosphere having an oxygen partial pressure ranging from 0.5 Pa to 4 Pa inclusive, it is possible to accomplish consistent film formation at a high rate. If the oxygen partial pressure is lower than 0.5 Pa, an oxygen-deficient oxide coating film (metal-rich oxide coating film), i.e., an oxide coating film having a composition value of less than 0.8 in terms of $x/(2a+1.5b+2c)$ or $x/(2a+1.5d+1.5b+2c)$ is formed to provide inadequate hardness. The oxygen partial pressure should be preferably one Pa or more. On the other hand, if the oxygen partial pressure exceeds 4 Pa, gaseous film-forming particles scatter to cause a decrease in film forming rate, which is disadvantageous in productivity. The upper limit of oxygen partial pressure should be preferably no higher than 2 Pa.

It is preferable that the temperature of a substrate in hard coating film formation should be 500° C. or more for forming a crystalline oxide coating film. The substrate temperature should be more preferably 550° C. or more. It is to be noted, however, that too high a substrate temperature will cause deterioration of the substrate. The upper limit of substrate temperature should be preferably no higher than 750° C., more preferably no higher than 700° C.

As regards procedures for intermediate layer formation, no particular limitations are specified. It is advisable to form an intermediate layer of TiN, CrN or TiAlN, for example, in a nitrogen atmosphere by AIP or sputtering with use of a Ti target, Cr target or TiAl target.

To enhance adhesiveness between the intermediate layer and the hard coating film, it is preferable that after formation of the intermediate layer as mentioned above, the surface thereof should be oxidized under processing conditions of 500° C. or more in substrate temperature and one Pa or more in oxygen partial pressure. More preferably, the surface of the intermediate layer should be oxidized under processing conditions of 600° C. or more in substrate temperature and 5 Pa or more in oxygen partial pressure. On the other hand, since too high a substrate temperature will cause deterioration of the substrate, the upper limit of substrate temperature should be preferably no higher than 750° C., more preferably no higher than 700° C. Further, if the oxygen partial pressure is too high, oxidation proceeds so quickly that a large proportion of the nitride film is oxidized, making it difficult to ensure desirable adhesiveness. Since there also occurs a decrease in film forming rate in case of an excessively high oxygen partial pressure, it is preferable that the upper limit of oxygen partial pressure should be no higher than 10 Pa.

To further enhance adhesiveness between the intermediate layer and the hard coating film, the intermediate layer may be formed to have a graded composition in which the content of nitrogen gradually decreases and the content of oxygen gradually increases in the direction from the substrate to the hard coating film. For providing such a composition gradient in the intermediate layer, under continuous discharging operation after formation of a nitride underlayer, the ratio of nitrogen content to oxygen content is so varied as to gradually increase the oxygen content while decreasing the total pressure, for instance, as shown in the examples to be given later.

FIG. 1 is an explanatory schematic diagram showing a configuration example of a film forming apparatus for producing hard coating films (and intermediate layers) according to a preferred embodiment of the present invention. The film forming apparatus exemplified in FIG. 1 is designed to allow simultaneous operations of AIP and sputtering. In this film forming apparatus, a vacuum chamber 1 thereof is provided with a rotating disc 2, on which four turntables 3 are disposed in a symmetrical fashion. On each of the turn tables 3, an object under processing (substrate) 5 is mounted. Around the rotating disc 2, there are disposed a plurality of arc evaporation sources 6a and 6b (cathodes) (two arc evaporation sources in FIG. 1), a plurality of sputter evaporation sources 6c and 6d (cathodes) (two sputter evaporation sources in FIG. 1), and heaters 7a, 7b, 7c and 7d. For the arc evaporation sources 6a and 6b and the sputter evaporation sources 6c and 6d, a plurality of arc power sources 8c and 8b and a plurality of sputter power sources 8c and 8d are disposed respectively.

In FIG. 1, reference numeral 11 indicates a filament-type ion source, numeral 12 indicates a filament-heating AC power supply, and reference numeral 13 indicates a discharging DC power supply. A filament (made of tungsten) of the filament-type ion source 11 is heated by a current applied from the filament-heating AC power supply 12, and thermoelectrons emitted from the filament are induced to the vacuum chamber 1 by the discharging DC power supply 13 to form a plasma (Ar) between the filament and chamber, thereby producing Ar ions. Using the Ar ions thus produced, the cleaning of the object under processing (substrate) 5 is carried out. The inside of the vacuum chamber 1 is evacuated by a vacuum pump P, and through mass flow controllers 9a, 9b, 9c and 9d, various film forming gases are introduced into the inside of the vacuum chamber 1.

A target having a particular component composition is used on each of the arc evaporation sources 6a and 6b and the sputter evaporation sources 6c and 6d. While the target is vaporized in an atmosphere of a film forming gas (O-source-containing gas, N-source-containing gas, dilute gas thereof with inert gas, or the like), the rotating disc 2 and the turn table 3 are turned to form a hard coating film on the surface of the object under processing (substrate) 5. In FIG. 10, reference numeral 10 indicates a bias power supply equipped for applying a negative (bias) voltage to the object under processing (substrate) 5.

The present invention will be described in more detail with reference to the following Examples; however, it is to be understood that the present invention is not limited by any of the details of the following examples and that various changes and modifications may be made in the present invention without departing from the spirit and scope thereof.

EXAMPLES

Example 1

Oxide coating films having the component compositions shown in TABLE 1 were formed on substrates by using the film forming apparatus shown in FIG. 1, and wear resistance evaluations were made on the oxide coating films thus formed.

Mirror-finished substrates made of cemented carbide (JIS-P class) and cutting tip substrates made of cemented carbide (SNGA120408) were used for film formation thereon in the film forming apparatus. After the vacuum chamber of the film forming apparatus was evacuated below $1 \times 10^{-3}$ Pa, each substrate was heated until the temperature thereof reached 550° C. Then, as an intermediate layer, a TiAlN film of approximately 1 µm in thickness was formed on the substrate. For the formation of each TiAlN film, AIP was carried out with a TiAl target in an atmosphere having a nitrogen partial pressure of 4 Pa under the conditions that the substrate temperature was 550° C. and the bias voltage applied to the substrate was −30 V.

Then, on the surface of each intermediate layer, an oxide coating film (approximately 5 µm in thickness) was formed according to the component compositions shown in TABLE 1. For the formation of each oxide coating film, AIP was carried out with a target having a component composition corresponding to the metallic components specified for the oxide coating film. Oxygen was introduced to provide an oxygen partial pressure of 1.3 Pa, and a current of 150 A was applied for arc discharging. To the substrate, a pulsing bias voltage of −100 V (frequency: 30 KHz, duty ratio: 75%) was applied for oxide film formation.

For the purpose of providing comparative examples, samples each having a TiAlN film only (approximately 5 µm in thickness), with no oxide coating film formed, were also prepared.

On each prepared sample having a coating film formed on a cemented carbide substrate thereof as mentioned above, Vickers hardness tests were conducted under measurement conditions of 0.25 N in load and 15 seconds in load-holding time. The component compositions of the oxide coating films and intermediate layers of the samples were determined by EDX analysis. (As regards the component compositions of the oxide coating films and intermediate layers formed in the following examples 2 to 5, EDX analysis was also carried out for confirmation as in the present example 1.) Further, on each prepared sample having a coating film formed on a cemented carbide cutting tip substrate thereof, cutting tests were conducted under the conditions shown below, and the amount of wear depth of each sample was measured for evaluation of wear resistance. The results of these tests and measurements are shown in TABLE 1.

[Cutting Test Conditions]
Work material: FCD400 (not heat treated)
Cutting speed: 200 m/minute
Depth of cut: 3 mm
Feed rate: 0.2 mm/revolution
Dry cutting without air blowing
Cutting time: 5 minutes
Amount of wear depth: Evaluated by depth of crater wear.

TABLE 1

| No. | Oxide coating film forming method | Metallic elements in oxide coating film (atomic ratio) | | | | | (2a + 1.5b + 2c) or (2a + 1.5d + 1.5b + 2c) | x/(2a + 1.5b + 2c) or: x/(2a + 1.5d + 1.5b + 2c) | Hardness GPa | Amount of wear depth µm |
|---|---|---|---|---|---|---|---|---|---|---|
| | | Al | Ti | Cr | Si | x | | | | |
| 1 | AIP method | TiAlN | | | | — | — | — | 25 | 15 |
| 2 | AIP method | 0.2 | 0.8 | 0 | 0 | 1.88 | 1.90 | 0.99 | 15 | 12 |
| 3 | AIP method | 0.3 | 0.7 | 0 | 0 | 1.87 | 1.85 | 1.01 | 22 | 6 |
| 4 | AIP method | 0.45 | 0.55 | 0 | 0 | 1.76 | 1.78 | 0.99 | 23 | 3.5 |
| 5 | AIP method | 0.6 | 0.4 | 0 | 0 | 1.70 | 1.70 | 1.00 | 25 | 3 |
| 6 | AIP method | 0.7 | 0.3 | 0 | 0 | 1.65 | 1.65 | 1.00 | 21 | 6.5 |
| 7 | AIP method | 0.85 | 0.15 | 0 | 0 | 1.48 | 1.58 | 0.94 | 14 | 14 |
| 8 | AIP method | 0.5 | 0 | 0.5 | 0 | 1.35 | 1.50 | 0.90 | 18 | 12 |
| 9 | AIP method | 0.5 | 0.05 | 0.45 | 0 | 1.50 | 1.53 | 0.98 | 22 | 2 |
| 10 | AIP method | 0.4 | 0.1 | 0.5 | 0 | 1.54 | 1.55 | 0.99 | 25 | 0.5 |
| 11 | AIP method | 0.4 | 0.2 | 0.4 | 0 | 1.60 | 1.60 | 1.00 | 24 | 2.5 |
| 12 | AIP method | 0.5 | 0.15 | 0.35 | 0 | 1.55 | 1.58 | 0.98 | 25 | 0.7 |
| 13 | AIP method | 0.6 | 0.1 | 0.3 | 0 | 1.57 | 1.55 | 1.01 | 23 | 1.2 |
| 14 | AIP method | 0.2 | 0.1 | 0.7 | 0 | 1.60 | 1.55 | 1.03 | 25 | 0.8 |
| 15 | AIP method | 0.2 | 0.2 | 0.6 | 0 | 1.62 | 1.60 | 1.01 | 24 | 0.8 |
| 16 | AIP method | 0.8 | 0 | 0.2 | 0 | 1.48 | 1.50 | 0.99 | 15 | 11 |
| 17 | AIP method | 0.1 | 0 | 0.9 | 0 | 1.50 | 1.50 | 1.00 | 18 | 11 |
| 18 | AIP method | 0.7 | 0.1 | 0.2 | 0 | 1.55 | 1.55 | 1.00 | 21 | 5.5 |
| 19 | AIP method | 0.6 | 0.3 | 0.1 | 0 | 1.60 | 1.65 | 0.97 | 20 | 6.7 |
| 20 | AIP method | 0.4 | 0.3 | 0.3 | 0 | 1.60 | 1.65 | 0.97 | 22 | 3.5 |
| 21 | AIP method | 0.2 | 0.3 | 0.5 | 0 | 1.62 | 1.65 | 0.98 | 23 | 3 |
| 22 | AIP method | 0.1 | 0.3 | 0.6 | 0 | 1.64 | 1.65 | 0.99 | 23 | 4 |
| 24 | AIP method | 0 | 0.3 | 0.7 | 0 | 1.60 | 1.65 | 0.97 | 23 | 4.5 |
| 25 | AIP method | 0.4 | 0.4 | 0.2 | 0 | 1.76 | 1.70 | 1.04 | 20 | 6.8 |
| 26 | AIP method | 0.2 | 0.4 | 0.4 | 0 | 1.75 | 1.70 | 1.03 | 20 | 7 |
| 27 | AIP method | 0.3 | 0.5 | 0.2 | 0 | 1.80 | 1.75 | 1.03 | 17 | 11 |
| 28 | AIP method | 0.1 | 0.6 | 0.3 | 0 | 1.75 | 1.80 | 0.97 | 16 | 12 |
| 29 | AIP method | 0.55 | 0.42 | 0 | 0.03 | 1.90 | 1.73 | 1.10 | 25 | 1.5 |
| 30 | AIP method | 0.5 | 0.43 | 0 | 0.07 | 1.66 | 1.75 | 0.95 | 27 | 0.5 |
| 31 | AIP method | 0.4 | 0.45 | 0 | 0.15 | 1.80 | 1.80 | 1.00 | 25 | 2 |
| 32 | AIP method | 0.4 | 0.4 | 0 | 0.2 | 1.77 | 1.80 | 0.98 | 22 | 4 |

TABLE 1-continued

| No. | Oxide coating film forming method | Metallic elements in oxide coating film (atomic ratio) | | | | x | (2a + 1.5b + 2c) or (2a + 1.5d + 1.5b + 2c) | x/(2a + 1.5b + 2c) or: x/(2a + 1.5d + 1.5b + 2c) | Hardness GPa | Amount of wear depth μm |
|---|---|---|---|---|---|---|---|---|---|---|
| | | Al | Ti | Cr | Si | | | | | |
| 33 | AIP method | 0.4 | 0.3 | 0 | 0.3 | 1.85 | 1.80 | 1.03 | 15 | 12 |
| 34 | AIP method | 0.55 | 0.22 | 0.2 | 0.03 | 1.70 | 1.63 | 1.04 | 26 | 1 |
| 35 | AIP method | 0.5 | 0.23 | 0.2 | 0.07 | 1.66 | 1.65 | 1.01 | 28 | 0.3 |
| 36 | AIP method | 0.4 | 0.25 | 0.2 | 0.15 | 1.70 | 1.70 | 1.00 | 26 | 1.5 |
| 37 | AIP method | 0.4 | 0.2 | 0.2 | 0.2 | 1.80 | 1.70 | 1.06 | 23 | 3 |
| 38 | AIP method | 0.4 | 0.15 | 0.15 | 0.3 | 1.76 | 1.73 | 1.02 | 14 | 12 |

With reference to TABLE 1, the following conclusion can be drawn on the basis of the experiment mentioned above: The oxide coating films (hard coating films) meeting the component compositions defined by the present invention have a high degree of hardness to provide wear resistance superior to conventional TiAlN films. In contrast, the oxide coating films not meeting the component compositions defined by the present invention have a relatively low degree of hardness to provide inferior wear resistance.

Example 2

Intermediate layers having the component compositions shown in TABLE 2 and hard coating films (oxide coating films) according to the present invention were formed on substrates by using the film forming apparatus shown in FIG. 1, and adhesiveness evaluations were made on the intermediate layers and hard coating films thus formed.

Mirror-finished substrates made of cemented carbide (JIS-P class) were used for film formation thereon in the film forming apparatus. After the vacuum chamber of the film forming apparatus was evacuated below $1 \times 10^{-3}$ Pa, each substrate was heated until the temperature thereof reached 550° C. Then, sputter cleaning with Ar ions was carried out. Thereafter, on each of sample substrates Nos. 2 to 10 listed in TABLE 2, an intermediate layer (approximately 1 μm in thickness) was formed as shown in TABLE 2. For the formation each intermediate layer, AIP was carried out with a target having a component composition corresponding to the metallic components specified for the intermediate layer. In this AIP, the substrate temperature was 500° C., the nitrogen partial pressure was 4 Pa, and the bias voltage applied to the substrate was −50 V.

Then, on each of the intermediate layers and substrates, an oxide coating film (hard coating film, approximately 5 μm in thickness) was formed according to the component compositions shown in TABLE 2. For the formation of each oxide coating film, AIP was carried out with a target having a component composition corresponding to the metallic components specified for the oxide coating film. Oxygen was introduced to provide an oxygen partial pressure of 1.3 Pa, and a current of 150 A was applied for arc discharging. To the substrate, a pulsing bias voltage of −100 V (frequency: 30 kHz, duty ratio: 75%) was applied for oxide film formation.

On each of sample substrates Nos. 8 to 10 listed in TABLE 2, an intermediate layer was formed as shown in TABLE 2, and then oxidation treatment was performed for a period of 30 minutes at a constant substrate temperature of 650° C. with an increased oxygen partial pressure of 5 Pa. Thereafter, an oxide coating film (hard coating film) was formed in the same manner as mentioned above.

Adhesiveness evaluations were conducted on the coating films of the samples thus prepared. For evaluating the adhesiveness of the coating film formed on each sample, scratch tests with a diamond indenter (200 microns in R) were made to determine a level of load required for occurrence of a peeling-off of the coating film. In the scratch tests, the load increasing rate was 100 N/minutes, and the scratch rate was 10 mm/minutes. The measurement results of the scratch tests are shown in TABLE 2.

TABLE 2

| No. | Oxide coating film forming method | Intermediate layer | Oxide layer | Oxide coating layer | Load required for occurrence of peeling-off of coating film N |
|---|---|---|---|---|---|
| 1 | AIP method | None | None | (Al0.5Ti0.5)O | 20 |
| 2 | AIP method | TiN | None | (Al0.5Ti0.5)O | 55 |
| 3 | AIP method | CrN | None | (Al0.5Ti0.5)O | 60 |
| 4 | AIP method | (Ti0.5Al0.5)N | None | (Al0.5Ti0.5)O | 60 |
| 5 | AIP method | (Cr0.5Al0.5)N | None | (Al0.5Ti0.5)O | 65 |
| 6 | AIP method | (Ti0.2Cr0.15Al0.65)N | None | (Al0.5Ti0.5)O | 70 |
| 7 | AIP method | (Ti0.9Si0.1)N | None | (Al0.5Ti0.5)O | 65 |
| 8 | AIP method | (Ti0.1Cr0.3Al0.6)N | Formed | (Ti0.1Cr0.3Al0.6)O | 80 |
| 9 | AIP method | (Ti0.5Al0.5)N | Formed | (Al0.5Ti0.5)O | 85 |
| 10 | AIP method | (Ti0.1Cr0.3Al0.6)N | Formed | (Ti0.2Cr0.2Al0.55Si0.05)O | 87 |

With reference to TABLE 2, the following conclusion can be drawn on the basis of the experiment mentioned above: It is possible to enhance adhesiveness by forming the intermediate layer between the substrate and the hard coating film, and further enhancement can be made in adhesiveness by forming the hard coating film after oxidizing the surface of the intermediate layer formed on the substrate.

Example 3

Intermediate layers having the component compositions shown in TABLE 3 and hard coating films (oxide coating films) according to the present invention were formed on substrates by using the film forming apparatus shown in FIG.

1, and adhesiveness evaluations were made on the intermediate layers and hard coating films thus formed.

Mirror-finished substrates made of cemented carbide (JIS-P class) were used for film formation thereon in the film forming apparatus. After the vacuum chamber of the film forming apparatus was evacuated below $1 \times 10^{-3}$ Pa, each substrate was heated until the temperature thereof reached 550° C. Then, sputter cleaning with Ar ions was carried out. Thereafter, on each substrate, an intermediate layer (approximately 1 μm in thickness) was formed as shown in TABLE 3. For the formation of each intermediate layer, AIP was carried out with a target having a component composition corresponding to the metallic components specified for the intermediate layer.

In the case of formation of an intermediate layer not having a graded composition, a TiAlN film was formed at a bias voltage of −30 V in the same manner as in Example 1. In addition, a TiCrAlN film was formed at a bias voltage of −70 V in the same manner as in Example 1 (except the level of bias voltage).

In the case of formation of an intermediate layer having a graded composition in which the content of nitrogen gradually decreases and the content of oxygen gradually increases in the direction from the substrate to the hard coating film, a nitride underlayer having a certain composition was formed at each of the bias voltages indicated above, and then under continuous discharging operation, the ratio of nitrogen content to oxygen content was so varied as to gradually increase the oxygen content while decreasing the total pressure from 4 Pa to 1.3 Pa. In this step of graded composition formation, the bias voltage was also gradually varied to a level specified for oxide film formation (−100 V). (More specifically, in the formation of a TiAlN film as an intermediate nitride layer, the bias voltage was gradually varied from −30 V to −100 V. In the formation of a TiCrAlN film, the bias voltage was gradually varied from −70 V to −100 V.)

Then, on each of the intermediate layers thus formed, an oxide coating film (hard coating film, approximately 5 μm in thickness) was formed according to the component compositions shown in TABLE 3. For the formation of each oxide coating film, AIP was carried out with a target having a component composition corresponding to the metallic components specified for the oxide coating film. Oxygen was introduced to provide an oxygen partial pressure of 1.3 Pa, and a current of 150 A was applied for arc discharging. To the substrate, a pulsing bias voltage of −100 V (frequency: 30 kHz, duty ratio: 75%) was applied for oxide film formation.

On the coating films of the samples thus prepared, adhesiveness evaluations were conducted through scratch tests in the same manner as in Example 2. The measurement results of the scratch tests are shown in TABLE 3.

With reference to TABLE 3, the following conclusion can be drawn on the basis of the experiment mentioned above: In cases where the intermediate layer is interleaved between the substrate and the hard coating film, adhesiveness can be further enhanced by providing a graded composition in the intermediate layer in which the content of nitrogen gradually decreases and the content of oxygen gradually increases in the direction from the substrate to the hard coating film.

Example 4

Intermediate layers having the component compositions shown in TABLE 4 and hard coating films (oxide coating films) according to the present invention were formed on substrates by using the film forming apparatus shown in FIG. 1, and evaluations of the rates of film formation were made as described below.

Mirror-finished substrates made of cemented carbide (JIS-P class) were used for film formation thereon in the film forming apparatus. After the vacuum chamber of the film forming apparatus was evacuated below $1 \times 10^{-3}$ Pa, each substrate was heated until the temperature thereof reached 550° C. Then, sputter cleaning with Ar ions was carried out. Thereafter, on each substrate, an intermediate layer (approximately 1 μm in thickness) was formed according the component compositions shown in TABLE 4 in the same manner as in Example 2.

Then, on each of the intermediate layers thus formed, an oxide coating film (hard coating film, approximately 5 μm in thickness) was formed according to the component compositions shown in TABLE 4. For the formation of each oxide coating film, there was used a target having a component composition corresponding to the metallic components specified for the oxide coating film. In cases where AIP was employed for oxide coating film formation, oxygen was introduced to provide an oxygen partial pressure of 1.3 Pa, and a current of 150 A was applied for arc discharging. In cases where sputtering was employed for oxide coating film formation, a mixture gas of Ar and oxygen was so introduced as to provide a total pressure of 0.6 Pa and an oxygen partial pressure of 0.1 Pa, In either of the AIP and sputtering methods mentioned above, a pulsing bias voltage of −100 V (frequency: 30 kHz, duty ratio: 75%) was applied to the substrate for oxide coating film formation thereon.

The thicknesses of the oxide coating films (hard coating films) formed on the samples thus prepared were measured, and then the formation rates of the oxide coating films (hard coating films) were calculated from the measurement data. The results of the calculations are shown in TABLE 4.

TABLE 3

| No. | Oxide coating film forming method | Intermediate layer | Graded-composition layer | Oxide coating layer | Load required for occurrence of peeling-off of coating film N |
|---|---|---|---|---|---|
| 1 | AIP method | (Ti0.5Al0.5)N | None | (Al0.5Ti0.5)O | 60 |
| 2 | AIP method | (Ti0.5Al0.5)N | Formed | (Al0.5Ti0.5)O | 85 |
| 3 | AIP method | (Ti0.1Cr0.3Al0.6)N | None | (Ti0.1Cr0.3Al0.6)O | 65 |
| 4 | AIP method | (Ti0.1Cr0.3Al0.6)N | Formed | (Ti0.1Cr0.3Al0.6)O | 85 |
| 5 | AIP method | (Ti0.1Cr0.3Al0.6)N | None | (Ti0.2Cr0.2Al0.55Si0.05)O | 70 |
| 6 | AIP method | (Ti0.1Cr0.3Al0.6)N | Formed | (Ti0.2Cr0.2Al0.55Si0.05)O | 88 |

TABLE 4

| No. | Intermediate layer forming method | Intermediate layer | Oxide coating film forming method | Oxide coating film | Film forming rate μm/h |
|---|---|---|---|---|---|
| 1 | AIP method | (Ti0.5Al0.5)N | Sputtering method | (Al0.5Ti0.5)O | 0.5 |
| 2 | AIP method | (Ti0.5Al0.5)N | AIP method | (Al0.5Ti0.5)O | 5 |
| 3 | AIP method | (Ti0.2Cr0.15Al0.65)N | Sputtering method | (Ti0.2Cr0.15Al0.65)O | 0.6 |
| 4 | AIP method | (Ti0.2Cr0.15Al0.65)N | AIP method | (Ti0.2Cr0.15Al0.65)O | 4.5 |
| 5 | AIP method | (Ti0.2Cr0.15Al0.65)N | Sputtering method | (Ti0.2Cr0.2Al0.55Si0.05)O | 0.5 |
| 6 | AIP method | (Ti0.2Cr0.15Al0.65)N | AIP method | (Ti0.2Cr0.2Al0.55Si0.05)O | 5.1 |

With reference to TABLE 4, the following conclusion can be drawn on the basis of the experiment mentioned above: The film forming rate of the AIP method is an order of magnitude higher than that of the sputtering method.

Example 5

Using the film forming apparatus shown in FIG. 1, TiAlN films were formed as intermediate layers on substrates. Then, on the surface of the TiAlN film on each substrate, an oxide coating film having a component composition of $(Ti_{0.43}Al_{0.5}Si_{0.07})O_x$ or $(Ti_{0.1}Cr_{0.25}Al_{0.65})O_x$ was formed.

Then, effects on wear resistance and film forming rate with respect to each of x/(2a+1.5b+2c) and x/(2a+1.5 d+1.5b+2c) were examined.

Mirror-finished substrates made of cemented carbide (JIS-P class) and cutting tip substrates made of cemented carbide (SNGA120408) were used for firm formation thereon in the film forming apparatus. After the vacuum chamber of the film forming apparatus was evacuated below $1 \times 10^{-3}$ Pa, each substrate was heated until the temperature thereof reached 550° C. Then, sputter cleaning with Ar ions was carried out. Thereafter, on each substrate, a TiAlN film of approximately 1 μm in thickness was formed as an intermediate layer in the same manner as in Example 1.

Then, on the surface of each intermediate layer, an oxide coating film approximately 3 μm thick having a component composition of $(Ti_{0.43}Al_{0.5}Si_{0.07})O_x$ or $(Ti_{0.1}Cr_{0.25}Al_{0.65})O_x$ was formed by AIP with a target having a corresponding component composition of $Ti_{0.43}Al_{0.5}Si_{0.07}$ or $Ti_{0.1}Cr_{0.25}Al_{0.65}$, respectively. In the formation of the oxide coating film, the oxygen partial pressure was varied in the range from 0.5 to 5 Pa, and arc discharging was made at a current of 100 A. To the substrate, a pulsing bias voltage of −100 V (frequency: 30 KHz, duty ratio: 75%) was applied for oxide film formation.

The thicknesses of the oxide coating films formed on the samples thus prepared were measured, and then the formation rates of the oxide coating films were calculated from the measurement data. Further, wear resistance evaluations were made on each prepared sample having an oxide coating film formed on a cemented carbide cutting tip substrate thereof. The results of the calculations and evaluations are shown in TABLE 5.

TABLE 5

| No. | Oxide coating film | Oxide coating film forming method | Oxygen partial pressure Pa | Substrate temperature °C. | x | (2a + 1.5b + 2c) or (2a + 1.5d + 1.5b + 2c) | x/(2a + 1.5b + 2c) or x/(2a + 1.5d + 1.5b + 2c) | Hardness GPa | Amount of wear depth μm | Film forming rate μm/h |
|---|---|---|---|---|---|---|---|---|---|---|
| 1 | (Ti0.43Al0.5Si0.07)Ox | AIP method | 0 | 550 | 0 | 1.75 | 0 | 5 | 30 | 14 |
| 2 | (Ti0.43Al0.5Si0.07)Ox | AIP method | 0.2 | 550 | 0.53 | 1.75 | 0.30 | 10 | 22 | 11 |
| 3 | (Ti0.43Al0.5Si0.07)Ox | AIP method | 0.3 | 550 | 1.10 | 1.75 | 0.63 | 11 | 17 | 9 |
| 4 | (Ti0.43Al0.5Si0.07)Ox | AIP method | 0.5 | 550 | 1.59 | 1.75 | 0.91 | 18 | 8 | 5 |
| 5 | (Ti0.43Al0.5Si0.07)Ox | AIP method | 1 | 550 | 1.68 | 1.75 | 0.96 | 22 | 5 | 5.1 |
| 6 | (Ti0.43Al0.5Si0.07)Ox | AIP method | 2 | 550 | 1.75 | 1.75 | 1.00 | 21 | 3 | 4.8 |
| 7 | (Ti0.43Al0.5Si0.07)Ox | AIP method | 4 | 550 | 1.69 | 1.75 | 0.97 | 22 | 4 | 4 |
| 8 | (Ti0.43Al0.5Si0.07)Ox | AIP method | 10 | 550 | 1.73 | 1.75 | 0.99 | 20 | 4.5 | 0.7 |
| 9 | (Ti0.1Cr0.25Al0.65)Ox | AIP method | 0 | 550 | 0 | 1.55 | 0 | 3 | 25 | 15 |
| 10 | (Ti0.1Cr0.25Al0.65)Ox | AIP method | 0.2 | 550 | 0.60 | 1.55 | 0.39 | 11 | 16 | 10 |
| 11 | (Ti0.1Cr0.25Al0.65)Ox | AIP method | 0.3 | 550 | 1.00 | 1.55 | 0.65 | 12 | 13 | 8 |
| 12 | (Ti0.1Cr0.25Al0.65)Ox | AIP method | 0.5 | 550 | 1.40 | 1.55 | 0.90 | 21 | 7 | 6 |
| 13 | (Ti0.1Cr0.25Al0.65)Ox | AIP method | 1 | 550 | 1.50 | 1.55 | 0.97 | 24 | 2.5 | 5.4 |
| 14 | (Ti0.1Cr0.25Al0.65)Ox | AIP method | 2 | 550 | 1.55 | 1.55 | 1.00 | 25 | 2 | 5.7 |
| 15 | (Ti0.1Cr0.25Al0.65)Ox | AIP method | 4 | 550 | 1.50 | 1.55 | 0.97 | 23 | 4 | 3.5 |
| 16 | (Ti0.1Cr0.25Al0.65)Ox | AIP method | 10 | 550 | 1.53 | 1.55 | 0.99 | 22 | 5.5 | 0.5 |

With reference to TABLE 5, the following conclusion can be drawn on the basis of the experiment mentioned above: The oxide coating films meeting the component compositions of x/(2a+1.5b+2c) or x/(2a+1.5d+1.5b+2c) defined by the present invention have a high degree of hardness to provide excellent wear resistance. In contrast, the oxide coating films not satisfying the specified lower limit of the component compositions of x/(2a+1.5b+2c) or x/(2a+1.5d+1.5b+2c) defined by the present invention, i.e., the metal-rich oxide coating films have inferior wear resistance though the film forming rates thereof are relatively high.

The invention may be embodied in other specific forms without departing from the spirit or essential characteristics thereof. The present embodiments and examples are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A hard coating film formed on the surface of a substrate, wherein the hard coating film is represented by the formula:

wherein
 0.05≦a≦0.4
 0.1≦d≦0.85
 0.1≦b≦0.7
 0≦c≦0.2
 a+b+c+d=1
 0.8≦[x/(2a+1.5d+1.5b+2c)]≦1.2 where variables a, d, b, and c denote the atomic ratios of Ti, Cr, Al, and Si respectively, and variable x indicates the atomic ratio of O,
wherein the substrate is a substrate of a member selected from the group consisting of cutting tools, metal dies, jigs and plastic metal working tools.

2. A hard-coated material comprising a substrate and a hard coating film formed on the surface of said substrate, said hard coating film having a component composition defined in claim 1.

3. The hard-coated material as claimed in claim 2, further comprising an intermediate layer formed of a nitride containing one species or more of Ti and Cr, said intermediate layer being interleaved between said substrate and said hard coating film.

4. The hard-coated material as claimed in claim 3, wherein said hard coating film is formed on the surface of said intermediate layer after said surface of said intermediate layer is oxidized under processing conditions of 500° C. or more in substrate temperature and one Pa or more in oxygen partial pressure.

5. The hard-coated material as claimed in claim 3, wherein said intermediate layer has a graded composition in which nitrogen content gradually decreases and oxygen content gradually increases in the direction from said substrate to said hard coating film.

6. The hard coating film as defined in claim 1, wherein 0.03≦c≦0.2.

7. A cutting tool, metal die or a jig comprising the hard coating film as defined in claim 6.

8. A hard-coated material comprising a substrate and a hard coating film formed on the surface of said substrate, said hard coating film having a component composition defined in claim 6.

9. The hard-coated material as claimed in claim 8, further comprising an intermediate layer formed of a nitride containing one species or more of Ti and Cr, said intermediate layer being interleaved between said substrate and said hard coating film.

10. The hard coated film as claimed in claim 9, wherein a surface of the intermediate layer having the hard coating layer is oxidized under processing conditions of 500° C. or more in substrate temperature and one Pa or more in oxygen partial pressure.

11. A cutting tool, metal die or a jig comprising the hard coating film as defined in claim 10.

12. The hard-coated material as claimed in claim 10, wherein said intermediate layer has a graded composition in which nitrogen content gradually decreases and oxygen content gradually increases in the direction from said substrate to said hard coating film.

13. A method of forming a hard coating film having a component composition defined in claim 1, comprising:
 providing a processing atmosphere having an oxygen partial pressure ranging from 0.5 Pa to 4 Pa inclusive; and
 carrying out cathode-discharge arc ion plating to form said hard coating film in said processing atmosphere.

* * * * *